United States Patent
Yoshida

(10) Patent No.: US 10,236,044 B2
(45) Date of Patent: Mar. 19, 2019

(54) MEMORY SYSTEM

(71) Applicant: Toshiba Memory Corporation, Tokyo (JP)

(72) Inventor: Norikazu Yoshida, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/693,410

(22) Filed: Aug. 31, 2017

(65) Prior Publication Data

US 2018/0277180 A1   Sep. 27, 2018

(30) Foreign Application Priority Data

Mar. 24, 2017  (JP) ................................. 2017-059222

(51) Int. Cl.
  *G11C 8/16*   (2006.01)
  *G11C 16/08*  (2006.01)
  *G06F 12/02*  (2006.01)

(52) U.S. Cl.
  CPC ............ *G11C 8/16* (2013.01); *G06F 12/0207* (2013.01); *G11C 16/08* (2013.01); *G06F 12/0246* (2013.01)

(58) Field of Classification Search
  CPC ....................................................... G11C 8/16
  USPC ...................................... 365/230.05, 189.05
  See application file for complete search history.

(56) References Cited

U.S. PATENT DOCUMENTS

| | | | | |
|---|---|---|---|---|
| 5,943,283 A * | 8/1999 | Wong | ................... | G06F 12/1408 365/221 |
| 6,567,334 B2 * | 5/2003 | Yamagami | ............ | G06F 3/0601 365/230.01 |
| 7,190,617 B1 * | 3/2007 | Harari | ................... | G06F 3/0614 365/185.11 |
| 8,943,283 B2 * | 1/2015 | Fiske | ................... | G06F 11/1456 711/162 |
| 9,214,232 B2 | 12/2015 | Mangalindan et al. | | |
| 9,293,224 B1 | 3/2016 | Nguyen et al. | | |
| 9,966,146 B2 * | 5/2018 | Watanabe | .............. | G11C 16/26 |
| 2006/0050593 A1 * | 3/2006 | Toyama | ................. | G11C 16/20 365/230.03 |
| 2007/0103992 A1 * | 5/2007 | Sakui | ................. | G06F 12/0246 365/185.33 |
| 2008/0301397 A1 * | 12/2008 | Goh | .................... | G06F 12/0246 711/202 |
| 2009/0027970 A1 * | 1/2009 | Roohparvar | ........... | G11C 16/10 365/185.18 |
| 2010/0281232 A1 * | 11/2010 | Takagi | ................ | G06F 12/0292 711/170 |
| 2011/0072205 A1 * | 3/2011 | Lee | ......................... | G11C 29/08 711/105 |
| 2011/0078390 A1 * | 3/2011 | Yamauchi | ............. | G06F 11/004 711/154 |

(Continued)

*Primary Examiner* — Michael Tran
(74) *Attorney, Agent, or Firm* — Kim & Stewart LLP

(57) ABSTRACT

A memory system includes a semiconductor memory and a controller. The controller is configured to perform a read operation on the semiconductor memory in response to a read instruction received from a host. In response to the read instruction that includes a first logical address, the controller converts the first logical address into a first physical address, and issues a read command and a second physical address different from the first physical address, to the semiconductor memory.

28 Claims, 12 Drawing Sheets

(56) References Cited

U.S. PATENT DOCUMENTS

| | | | |
|---|---|---|---|
| 2012/0290772 A1* | 11/2012 | Asano | G06F 12/0246 711/103 |
| 2013/0121093 A1* | 5/2013 | Morimoto | G06F 13/00 365/189.15 |
| 2013/0229861 A1* | 9/2013 | Ueda | G11C 11/1673 365/158 |
| 2014/0095946 A1* | 4/2014 | Mozak | G11C 29/56 714/718 |
| 2015/0131356 A1* | 5/2015 | Kurokawa | H01L 22/20 365/51 |
| 2015/0199230 A1* | 7/2015 | Park | G11C 29/76 714/6.21 |
| 2015/0212742 A1* | 7/2015 | Matsuzawa | G06F 12/0207 711/154 |
| 2015/0268859 A1* | 9/2015 | Mori | G06F 3/061 711/170 |
| 2016/0012891 A1 | 1/2016 | Intrater et al. | |
| 2016/0118129 A1* | 4/2016 | Muchherla | G11C 16/26 365/185.12 |
| 2016/0260481 A1* | 9/2016 | Miura | G11C 13/0033 |
| 2017/0046272 A1* | 2/2017 | Farmahini-Farahani | G06F 12/1009 |
| 2017/0083264 A1* | 3/2017 | Lee | G06F 12/08 |
| 2017/0116237 A1* | 4/2017 | Zhang | G06F 17/30315 |
| 2017/0140807 A1* | 5/2017 | Sun | G11C 11/2275 |
| 2017/0147504 A1* | 5/2017 | Chang | G06F 12/0246 |
| 2017/0161191 A1* | 6/2017 | Cohen | G06F 12/0815 |
| 2017/0185294 A1* | 6/2017 | Moon | G06F 3/061 |
| 2017/0192902 A1* | 7/2017 | Hwang | G06F 12/0246 |
| 2017/0242595 A1* | 8/2017 | Niu | G06F 3/0613 |
| 2017/0286311 A1* | 10/2017 | Juenemann | G06F 12/10 |
| 2017/0300423 A1* | 10/2017 | Kamruzzaman | G06F 12/109 |
| 2018/0025776 A1* | 1/2018 | Achtenberg | G11C 11/5628 |
| 2018/0108404 A1* | 4/2018 | Miura | G11C 13/0004 |
| 2018/0121364 A1* | 5/2018 | Edgar | G06F 12/1009 |
| 2018/0129423 A1* | 5/2018 | Amato | G06F 3/0611 |
| 2018/0129424 A1* | 5/2018 | Confalonieri | G06F 3/0611 |

\* cited by examiner

MEMORY SYSTEM

CROSS-REFERENCE TO RELATED APPLICATION

This application is based upon and claims the benefit of priority from Japanese Patent Application No. 2017-059222, filed Mar. 24, 2017, the entire contents of which are incorporated herein by reference.

FIELD

Embodiments described herein relate generally to a memory system.

BACKGROUND

In recent years, an interface capable of transmitting and receiving data at a high speed is required in a memory system using NAND flash memory.

DETAILED DESCRIPTION

Figure 1:
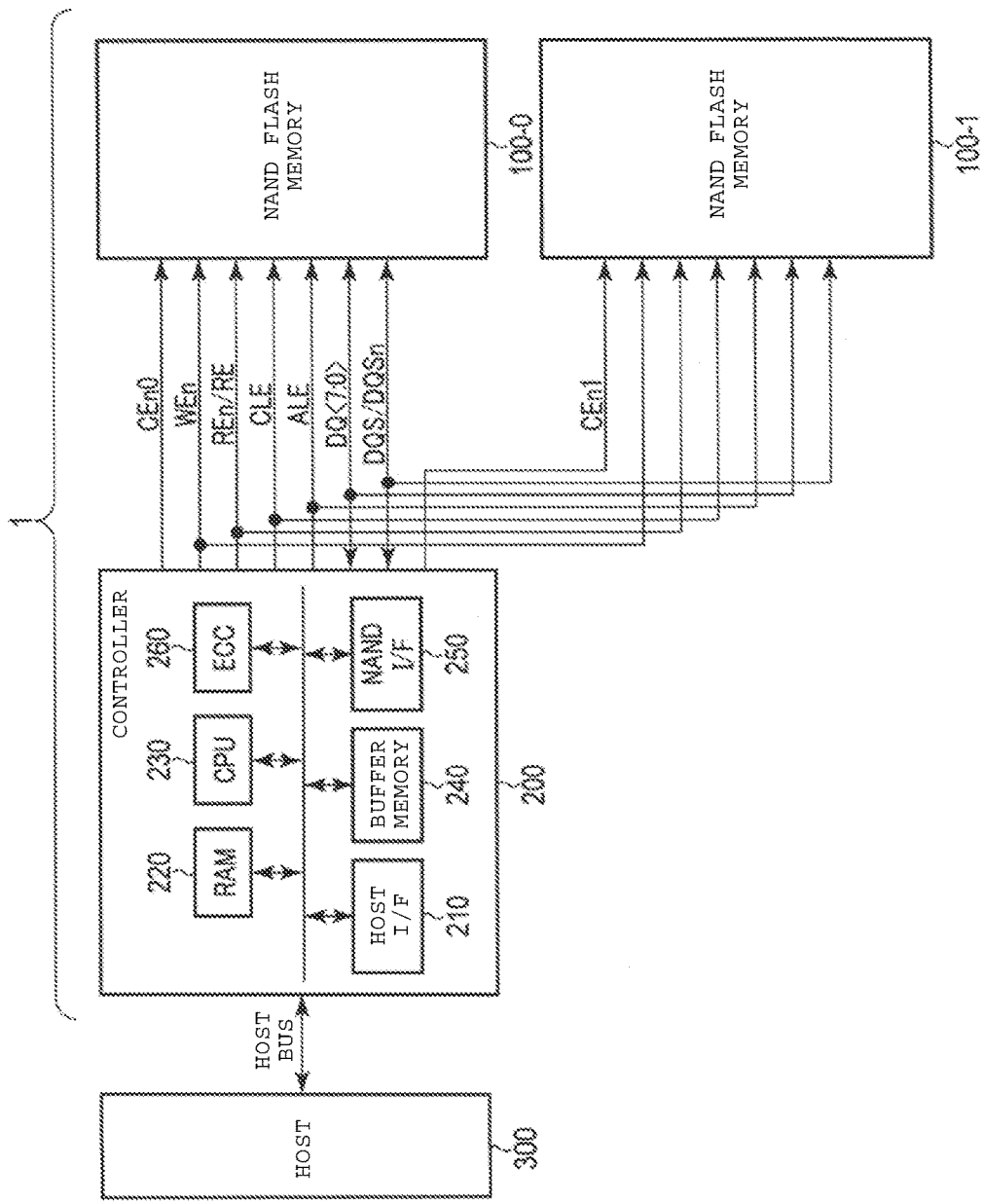
FIG. 1 is a block diagram of a memory system according to a first embodiment.

Embodiments provide a memory system capable of improving operational reliability.

In general, according to one embodiment, a memory system includes a semiconductor memory and a controller. The controller is configured to perform a read operation on the semiconductor memory in response to a read instruction received from a host. In response to the read instruction that includes a first logical address, the controller converts the first logical address into a first physical address, and issues a read command and a second physical address different from the first physical address, to the semiconductor memory.

In the following, embodiments of the invention will be described with reference to the drawings. In the following description, common reference numerals are given to constitutional elements having the same function and configuration.

1. First Embodiment

A memory system according to a first embodiment will be described. In the following, a memory system including a NAND flash memory as a semiconductor storage device will be described by way of an example.

1.1 Configuration

1.1.1 Entire Configuration of Memory System

First, the entire configuration of a memory system according to a first embodiment will be described using FIG. 1.

As illustrated in the figure, a memory system 1 includes a plurality of NAND flash memories 100 (in the present example, 100-0 and 100-1) and a controller 200 that controls the NAND flash memories. The NAND flash memories 100 and the controller 200, for example, may be formed into a single semiconductor device, and examples of such a semiconductor device include a memory card such as an SD™ card, a solid state drive (SSD) and the like. The number of the NAND flash memories 100 controlled by the same controller 200 within the memory system 1 is not limited to two, and may be one or may be three or more. The controller 200 and the NAND flash memories 100-0 and 100-1 are formed on semiconductor chips, which are different from each other, respectively. In the following, the semiconductor chips on which the NAND flash memory 100 and the controller 200 are formed are respectively called a memory chip and a controller chip.

The NAND flash memory 100 includes a plurality of memory cells and stores data in a nonvolatile manner. The controller 200 is connected to the NAND flash memory 100 by a NAND bus and is connected to a host device 300 by a host bus. The controller 200 controls the NAND flash memory 100 and accesses the NAND flash memory 100 in response to an instruction received from the host device 300. The host device 300 is, for example, a digital camera and a personal computer and the host bus is, for example, a bus according to SD™ interface specifications.

The NAND bus transmits and receives signals according to a NAND interface specifications. Specific example of the signals is a chip enable signal CEn (in the present example, CEn0 and CEn1), an address latch enable signal ALE, a command latch enable signal CLE, a write enable signal WEn, a read enable signal REn/RE, an input/output clock signal DQS/DQSn, and an input/output signal DQ<0:7>. The signal DQ<0:7> denotes an 8-bit signal DQ of signals DQ0 to DQ7 and in a case where bits are not distinguished from one another, it is simply denoted as a signal DQ. Although the signal CEn is prepared for each memory chip, the signals ALE, CLE, WEn, REn/RE, DQS/DQSn, and DQ unlike the signal CEn may be used in common between a plurality of memory chips.

The signal CEn is a signal which is asserted at a low level and activates the NAND flash memory 100. In the present example, the controller 200 allows the signal CEn0 to go to a low level when activating the NAND flash memory 100-0 and allows the signal CEn1 to go to the low level when activating the NAND flash memory 100-1. The signals CLE and ALE are signals notifies the NAND flash memory 100 that the input signals DQ to the NAND flash memory 100 are respectively a command and an address. The signal WEn is asserted at the low level and is a signal for fetching the signal ALE and the input signal DQ into the NAND flash memory 100. The signals REn and RE are complementary signals (also referred to as differential signals herein) and the signal REn is asserted at the low level. The signals REn and RE are signals for reading the output signal DQ from the NAND flash memory 100. The input/output signal DQ represents a unit of data transmitted and received between the NAND flash memory 100 and the controller 200 and includes a command, an address, write data, read data, or the like.

The signals DQS and DQSn are complementary signals and the signal DQSn is asserted at the low level. The signals DQS and DQSn function as a clock synchronizing write data and read data. For example, at the time of data read, the NAND flash memory 100 generates the signals DQS and DQSn and transmits read data to the controller 200 in synchronization with the signals DQS and DQSn. The controller 200 receives read data in synchronization with the signals DQS and DQSn. On the other hand, at the time of data write, the controller 200 generates the signals DQS and DQSn and transmits write data to the NAND flash memory 100 in synchronization with the signals DQS and DQSn. The NAND flash memory 100 receives write data in synchronization with the signals DQS and DQSn.

1.1.2 Configuration of Controller 200

Subsequently, details of the configuration of the controller 200 will be described using FIG. 1. As illustrated in FIG. 1, the controller 200 includes a host interface circuit 210, a built-in memory (RAM) 220, a processor (CPU) 230, a buffer memory 240, a NAND interface circuit 250, and an error checking and correcting (ECC) circuit 260.

The host interface circuit 210 is connected to the host device 300 through the host bus and transfers an instruction and data received from the host device 300 to the processor 230 and the buffer memory 240, respectively. The host interface circuit 210 transfers data within the buffer memory 240 to the host device 300 in response to the instruction of the processor 230.

The processor 230 controls the entire operation of the controller 200. For example, when a write instruction is received from the host device 300, the processor 230 issues a write instruction to the NAND interface circuit 250 in response to the received instruction. The processor 230 similarly operates in response to data read and data erase instructions. The processor 230 executes various processing, such as wear-leveling, for managing the NAND flash memory 100.

The NAND interface circuit 250 is connected to the NAND flash memory 100 through the NAND bus and manages communication with the NAND flash memory 100. The NAND interface circuit 250 transmits various signals to the NAND flash memory 100 and receives various signals from the NAND flash memory 100 based on the instruction received from the processor 230.

The buffer memory 240 temporarily holds write data and read data.

The built-in memory 220 is a semiconductor memory, for example, DRAM and/or SRAM, and is used as a working area for the processor 230. The built-in memory 220 holds firmware for managing the NAND flash memory 100, various management tables, and the like. A conversion table which will be described later and holds the relationship between the logical address and the physical address is also held, for example, in the memory 220 during operation.

The ECC circuit 260 performs error detection processing and error correction processing relating to data stored in the NAND flash memory 100. That is, the ECC circuit 260 generates an error correction code at the time of data write, assigns the code to write data, decodes the code at the time of data read.

1.1.3 Configuration of NAND Flash Memory 100

1.1.3.1 Entire Configuration

Figure 2:
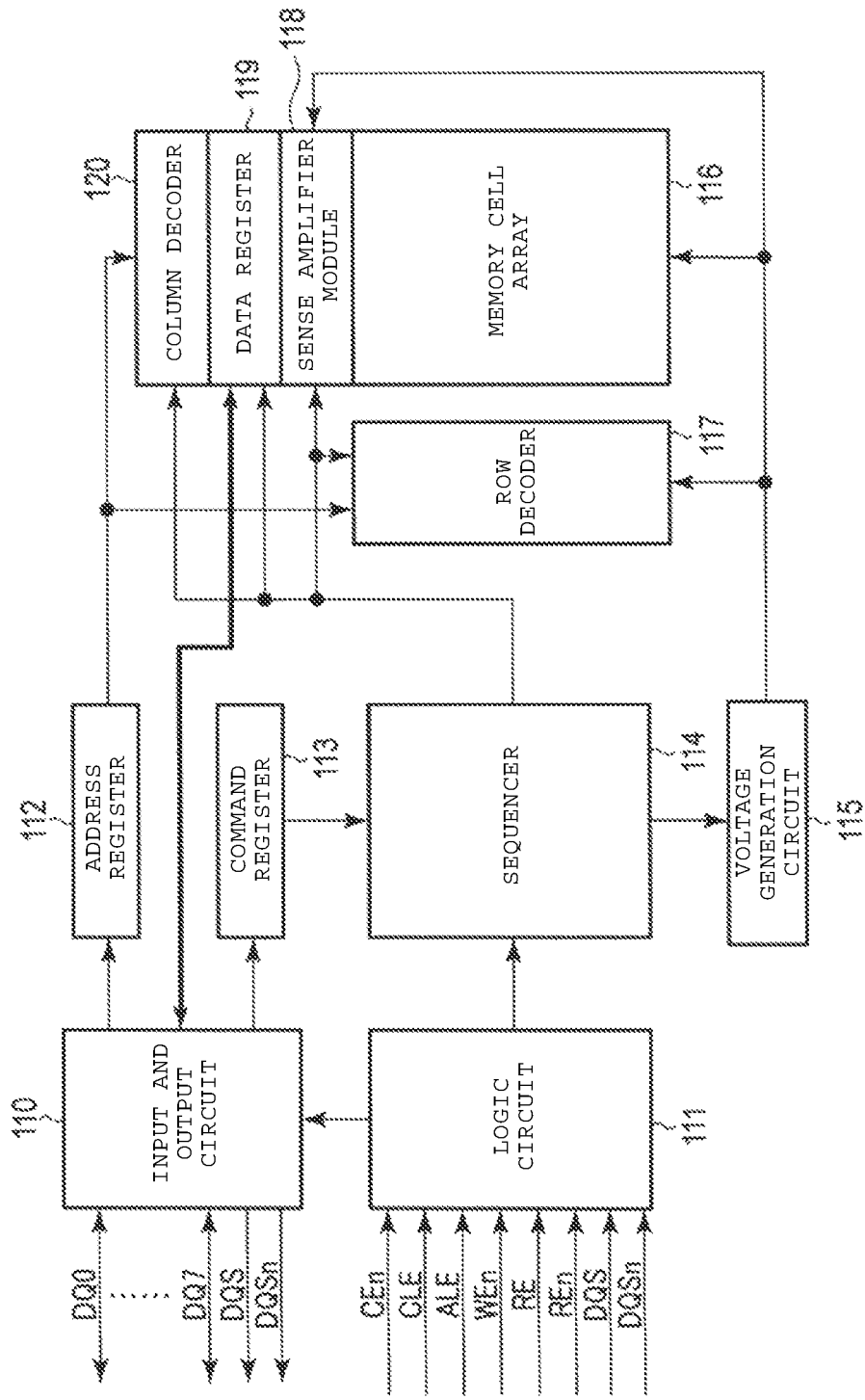
FIG. 2 is a block diagram of a NAND flash memory according to the first embodiment.

Next, a configuration of the NAND flash memory 100 will be described using FIG. 2. FIG. 2 is a block diagram of the NAND flash memory 100.

As illustrated in the figure, the NAND flash memory 100 includes an input and output circuit 110, a logic circuit 111, an address register 112, a command register 113, a sequencer 114, a voltage generation circuit 115, a memory cell array 116, a row decoder 117, a sense amplifier module 118, a data register 119, and a column decoder 120.

The logic circuit 111 receives the signals CEn, CLE, ALE, WEn, REn/RE, and DQS/DQSn from the controller 200. The logic circuit 111 transfers the signals to the input and output circuit 110 and the sequencer 114 as needed.

The input and output circuit 110 transmits the signal DQS/DQSn and transmits and receives the signal DQ. When the signal DQ is an address, the input and output circuit 110 transfers the signal DQ to the address register 112 and when the signal DQ is a command, the input and output circuit 110 transfers the signal DQ to the command register 113. Furthermore, at the time of data write, when the signal DQ is write data, the input and output circuit 110 transfers write data to the data register 119. On the other hand, at the time of data read, the input and output circuit 110 transmits read data transferred from the data register 119 and the signal DQS/DQSn to the controller 200.

The address register 112 and the command register 113 hold an address and a command given from the controller 200, respectively. The data register 119 holds write data given from the controller 200 or read data from the memory cell array 116.

The sequencer 114 controls the entire operation of the the NAND flash memory 100. More specifically, the sequencer 114 instructs a circuit block to perform an operation at timings when various signals are received in the logic circuit 111 according to the command held in the command register 113.

The voltage generation circuit 115 supplies a voltage to the memory cell array 116, the row decoder 117, and the sense amplifier 118 according to the instruction of the sequencer 114.

The memory cell array 116 includes a plurality of blocks (not illustrated) including a plurality of nonvolatile memory cells correlated with a row and a column. The memory cell array 116 stores, for example, data given from the controller 200.

The row decoder 117 decodes a row address held in the address register 112. The row decoder 117 selects one of the blocks in the memory cell array 116 based on the decoded result and further selects a row in the selected block.

The sense amplifier 118, at the time of data read, senses data read from the memory cell array 116 and performs the required operation. The sense amplifier 118 transmits the read data to the data register 119. On the other hand, at the time of data write, the sense amplifier 118 writes data held in the data register 119 into the memory cell array 116.

The column decoder 120 decodes the column address held in the address register 112. The column decoder 120 selects a column position of the data register 119 based on the decoded result. For example, at the time of data read, read data is transmitted to the controller 200 in units of columns in order starting from the column position selected by the column decoder 120.

1.1.3.2 Configuration of Memory Cell Array

Figure 3:
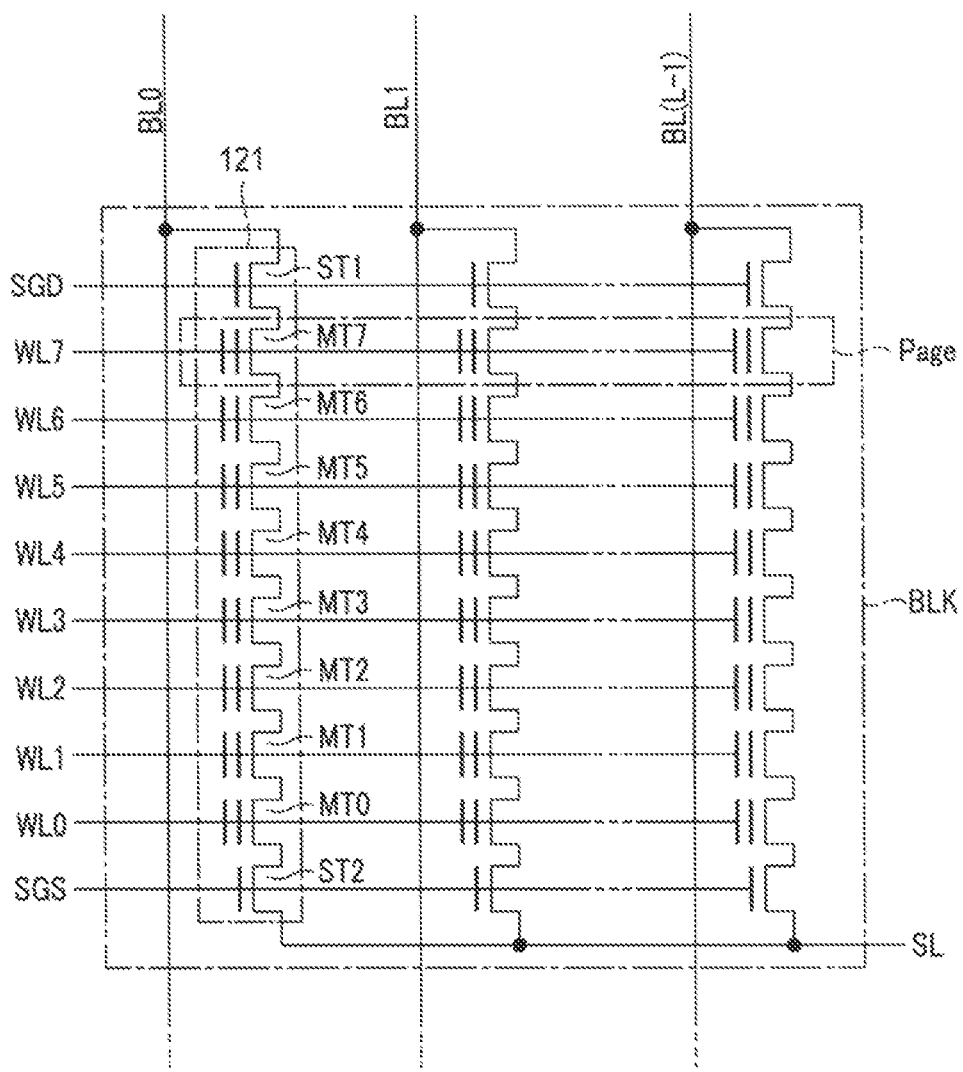
FIG. 3 is a circuit diagram of a memory cell array according to the first embodiment.

Next, a configuration of the memory cell array 116 will be described using FIG. 3. FIG. 3 is a circuit diagram of a plurality of blocks included in the memory cell array 116.

As illustrated in the figure, a block BLK includes a plurality of NAND strings 121. Each NAND string 121 includes, for example, eight memory cell transistors MT (MT0 to MT7) and select transistors ST1 and ST2. The memory cell transistor MT includes a control gate and a charge storage layer and holds data in a nonvolatile manner. The memory cell transistors MT are connected in series between a source of the select transistor ST1 and a drain of the select transistor ST2.

Gates of the select transistors ST1 and ST2 within the same block are respectively connected to the selection gate lines SGD and SGS in common. Similarly, the control gates of the memory cell transistors MT0 to MT7 within the same block are respectively connected to word lines WL0 to WL7 in common.

The drains of the select transistors ST1 of the NAND strings 121 in the same column within the memory cell array 110 are connected to one of the bit lines BL (BL0 to BL (L-1), (L-1) is a natural number of 1 or more) in common. That is, the NAND strings 121 are connected to the bit line BL in common across a plurality of blocks BLK. Furthermore, sources of the plurality of select transistors ST2 are connected to the source line SL in common.

Each memory cell transistor MT is able to hold data of a single bit or a plurality of bits. Data is collectively written to the memory cell transistors MT connected to the same word line WL for each bit. Data to be collectively written is called a "page". In a case where the memory cell transistor MT holds a single bit, a set of the memory cell transistors MT connected to each word line WL corresponds to one page. That is, a single page is allocated to a single word line WL and a block BLK including eight word lines WL has a capacity of eight pages. When the memory cell transistor MT holds, for example, data of two bits (referred to as a lower bit and an upper bit), a set of the lower bits held by the memory cells connected to the same word line is one page (referred to as lower page) and a set of the upper bits is one page (referred to as upper page). That is, two pages are allocated to a single word line WL and the block BLK has a capacity of sixteen pages. Alternatively, the "page" can be defined as a portion of a memory space formed with the memory cells connected to the same word line. Data write and data read may be performed for each page described above. Data erase is performed in units of blocks BLK.

The memory cell array 116 may have a configuration in which the memory cell transistors are arranged three-dimensionally by being stacked above a semiconductor substrate. In an example of such a configuration, metal wiring layers that respectively function as the selection gate line SGS, the word lines WL0 to WL7, and the selection gate line SGD are formed above the semiconductor substrate and a semiconductor pillar functioning as a current path of the NAND string 121 is provided so as to penetrate through the metal wiring layers. The metal wiring layer contacts one end of the semiconductor pillar such that a metal wiring layer functioning as the bit line BL is formed. The configuration of a three-dimensional NAND flash memory is described in, for example, U.S. patent application Ser. No. 12/407,403 of which the title is "THREE DIMENSIONAL STACKED NONVOLATILE SEMICONDUCTOR MEMORY" and which is filed Mar. 19, 2009, U.S. patent application Ser. No. 12/406,524 of which the title is "THREE DIMENSIONAL STACKED NONVOLATILE SEMICONDUCTOR MEMORY" and which is filed Mar. 18, 2009, U.S. patent application Ser. No. 12/679,991 of which the title is "NONVOLATILE SEMICONDUCTOR STORAGE DEVICE AND METHOD OF MANUFACTURING THE SAME" and which is filed Mar. 25, 2010, and U.S. patent application Ser. No. 12/532,030 of which the title is "SEMICONDUCTOR MEMORY AND METHOD FOR MANUFACTURING SAME" and which is filed Mar. 23, 2009. The entire contents of these patent applications are incorporated in the present specification by reference.

Data erase can be performed in units of blocks BLK or units smaller than the block BLK. An erase method is described in, for example, U.S. patent application Ser. No. 13/235,389 of which the title is "NONVOLATILE SEMICONDUCTOR MEMORY DEVICE" and which is filed Sep. 18, 2011, U.S. patent application Ser. No. 12/694,690 of which the title is "NON-VOLATILE SEMICONDUCTOR STORAGE DEVICE" and which is filed Jan. 27, 2010, and U.S. patent application Ser. No. 13/483,610 of which the title is "NONVOLATILE SEMICONDUCTOR MEMORY DEVICE AND DATA ERASE METHOD THEREOF" and which is filed May 30, 2012. The entire contents of these patent applications are incorporated in the present specification by reference.

Figure 4:
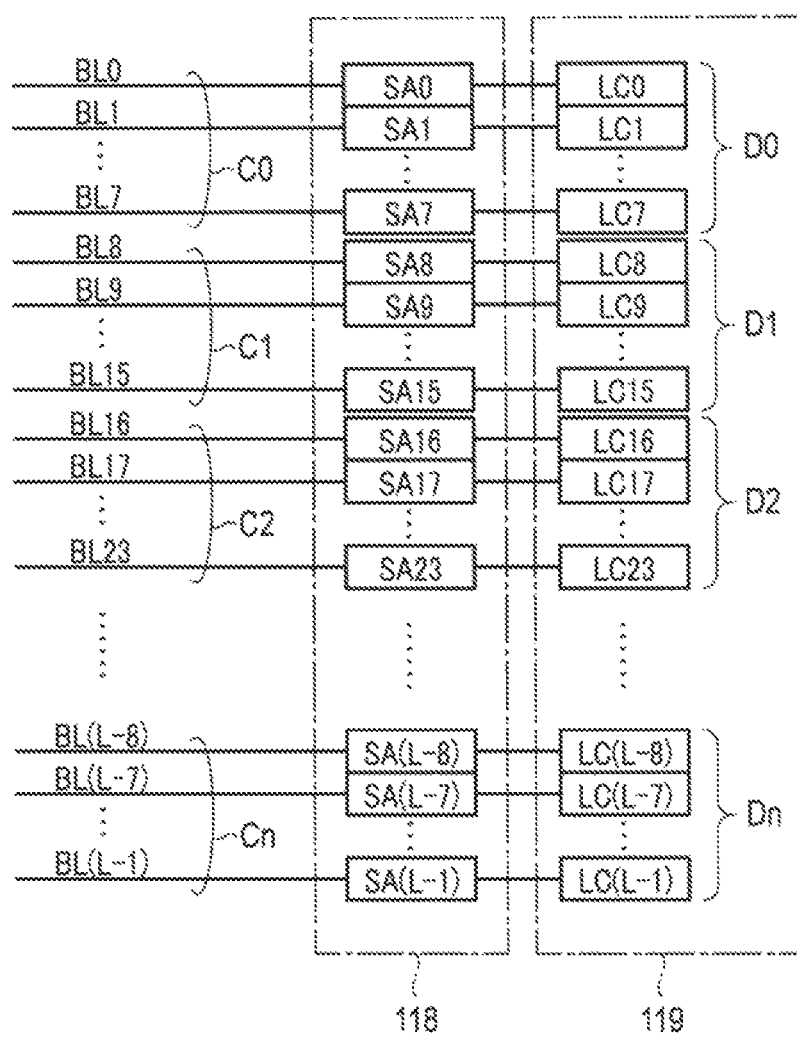
FIG. 4 is a block diagram of a sense amplifier module and a data register according to the first embodiment.

1.1.3.3 Concept of Column and Configuration of Sense Amplifier Module and Data Register Next, the concept of column and the configuration of the sense amplifier module 118 and the data register 119 will be described using FIG. 4. FIG. 4 is a block diagram of the sense amplifier module 118 and the data register 119.

First, the column will be described. As illustrated in FIG. 4, the memory cell array 116 includes L bit lines BL. For example, eight adjacent bit lines BL from the bit line BL0 in order become a unit called a single column. For example, as illustrated in FIG. 4, bit lines BL0 to BL7 belong to the column C0, bit lines BL8 to BL15 belong to the column C1, bit lines BL16 to BL23 belong to the column C2, and bit lines BL (L-8) to BL (L-1) belong to the column Cn, where n=(L/8). More generally, bit lines BL$8i$ to BL ($8i$+7) belong to the column Ci (where i is a natural number). In the following, in a case where the columns C0 to Cn are not discriminated, it is simply called a column C. In the following, description will be made by regarding column addresses CA0 to CAn, which correspond to the columns C0 to Cn, respectively.

Next, the sense amplifier module 118 will be described. As illustrated in FIG. 4, the sense amplifier module 118 includes L sense amplifiers SA (SA0 to SA (L-1)) that are respectively associated with bit lines BL0 to BL (L-1). The sense amplifier SA senses data, which is read onto an associated bit line BL, at the time of data read. On the other hand, the sense amplifier SA applies a voltage corresponding to write data to the associated bit line BL at the time of data write.

As illustrated in FIG. 4, the data register 119 includes L latch circuits LC (LC0 to LC (L-1)) that are respectively associated with the sense amplifiers SA0 to SA (L-1), that is, the bit lines BL0 to BL (L-1). Each latch circuit LC is able to hold data of at least one bit and in such a case, the data register 119 is able to hold one page of data. In a case where each memory cell transistor MT holds data of two bits or more, each latch circuit LC is also able to hold data of at least two bits or more and with this, the data register 119 is able to hold data for two pages or more. Among one page of data held by the data register 119, eight bits held by the latch circuits LC0 to LC7 are called data D0, eight bits held by the latch circuits LC8 to LC15 are called data D1, and similarly, eight bits held by the latch circuits LC (L−8) to LC (L−1) are called data Dn. That is, pieces of data D0 to Dn are respectively associated with the columns C0 to Cn.

The latch circuit LC holds data sensed by the associated sense amplifier SA at the time of data read. The data register 119 transfers data of the latch circuit LC corresponding to a column designated by the column address CA to the input and output circuit 110 each time when the signal REn/RE is toggled. For example, when the column C0 is selected by the column address CA0, data D0 is transferred from the latch circuits LC0 to LC7 to the input and output circuit 110.

At the time of data write, data to be written into the associated bit line BL is transferred to the latch circuit LC from the input and output circuit 110. The sense amplifier SA applies a voltage to the bit line BL according to data held in the associated latch circuit LC.

The column decoder 120 decodes, for example, the column address CA within the address register 112 at the time of data read. The column decoder 120 selects any of columns C based on the decoded result. As a result, pieces of read data are transferred to the input and output circuit 110 in order from the latch circuit LC corresponding to the column C selected by the column decoder 120.

1.1.4 Logical Address and Physical Address

Figure 5:
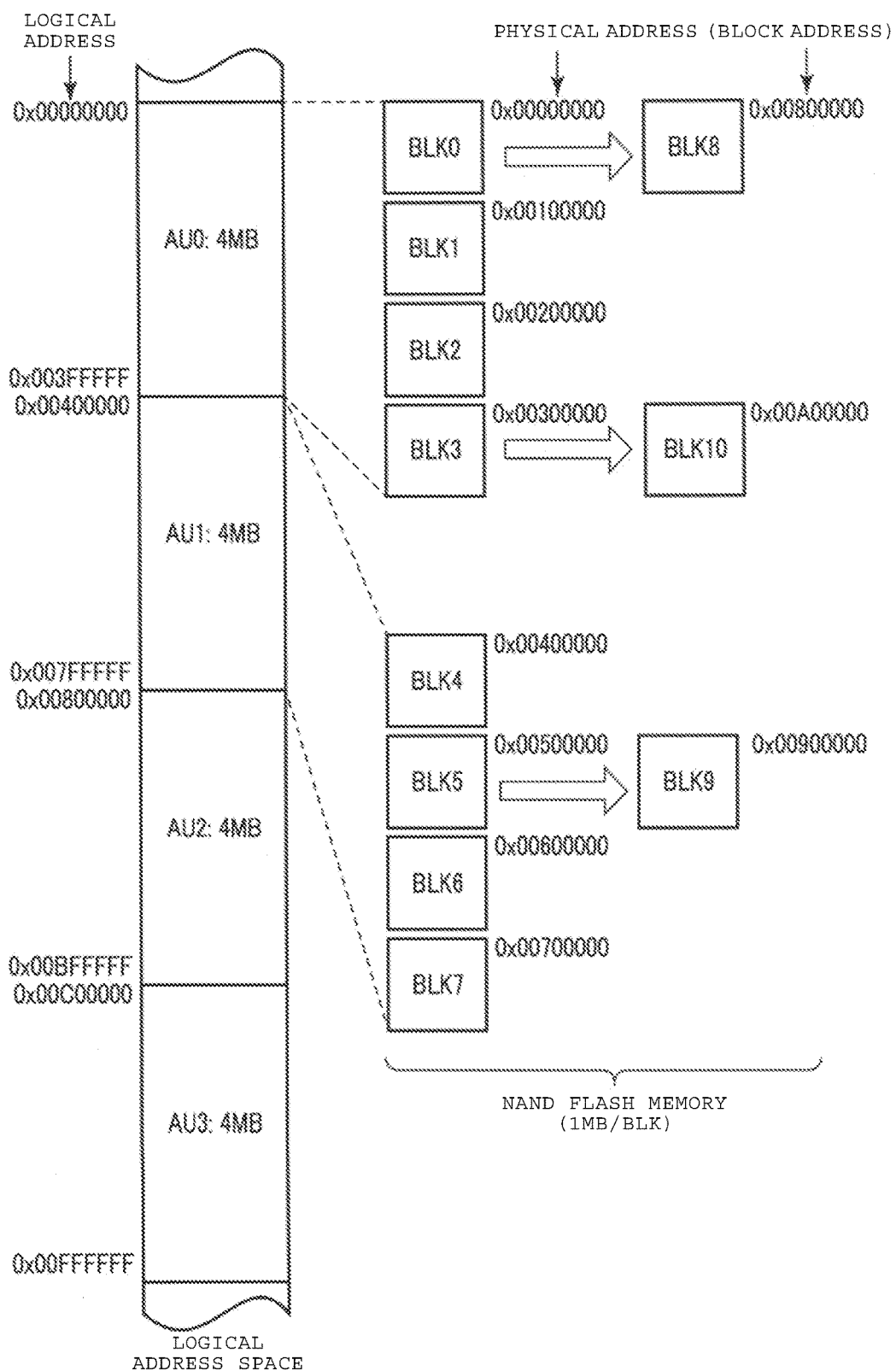
FIG. 5 is a conceptual diagram illustrating a relationship between a logical address space and a physical block.

Next, concepts of the logical address and the physical address will be described using FIG. 5. FIG. 5 is a conceptual diagram illustrating a relationship between a logical address space and a block BLK.

A block address unique to a block is allocated to each block BLK of the NAND flash memory 100. The block address is called a physical address. The column address and the page address are also similar, and unique addresses are respectively allocated to respective columns and pages. Accordingly, when the controller 200 accesses the NAND flash memory 100, the physical address is used.

On the other hand, the host device 300 does not recognize a physical address of the NAND flash memory 100. The host device 300 recognizes a logical address space based on a memory capacity of the NAND flash memory 100 and accesses the controller 200 using the logical address allocated to the logical address space.

Accordingly, the controller 200 tracks a relationship between a logical address from the host device 300 and a physical address in the NAND flash memory 100, that is, a correspondence relationship between the logical address and a physical block BLK, at all times. The correspondence relationship is held in a conversion table. The conversion table is read onto, for example, the RAM 220 and is used in, for example, the CPU 230 during operation of the memory system 1 and is saved in the NAND flash memory 100 during interruption of a power source.

In an example of FIG. 5, for example, the logical addresses of an area AU0 of a logical address space are 0x00000000 to 0x003FFFFF. The blocks BLK0 to BLK3 correspond to the area AU0. In other words, the area AU0 of the logical address space is formed with the memory cell transistors MT within the physical blocks BLK0 to BLK3, which are respectively allocated 0x00000000, 0x00100000, 0x00100000, and 0x00300000 as physical addresses.

The logical addresses of area AU1 of the logical address space are 0x00400000 to 0x007FFFFF. The blocks BLK4 to BLK7 correspond to the area AU1 and the physical addresses 0x00400000, 0x00500000, 0x00600000, and 0x00700000 are respectively allocated to the blocks BLK4 to BLK7.

As described above, an element that holds the correspondence relationship between the logical address and the physical address is the conversion table. The correspondence relationship between the logical address and the physical address is continuously changed, because data overwrite is not generally performed in the NAND flash memory. Accordingly, as illustrated in FIG. 5, for example, in a case where data within the block BLK0 is updated, updated data is written into, for example, another block BLK8. Then, the physical address corresponding to the logical address 0x00000000 is the address 0x00800000 which is not allocated to the block BLK0 but is allocated to the block BLK8. When updated data of the block BLK5 is written into the block BLK9, the physical address corresponding to the logical address 0x00500000 is an address 0x00900000.

As such, data is moved between the blocks in the NAND flash memory 100 and thus, information about which block BLK corresponds to which logical address space needs to be tracked at all times. The element responsible for tracking this information is the conversion table. The controller 200 converts the received logical address into a physical address using the conversion table when accessing the NAND flash memory 100 based on an instruction from the host device 300. The controller 200 issues an access instruction to the NAND flash memory 100 using the obtained physical address.

1.2 Read Operation

Figure 6:
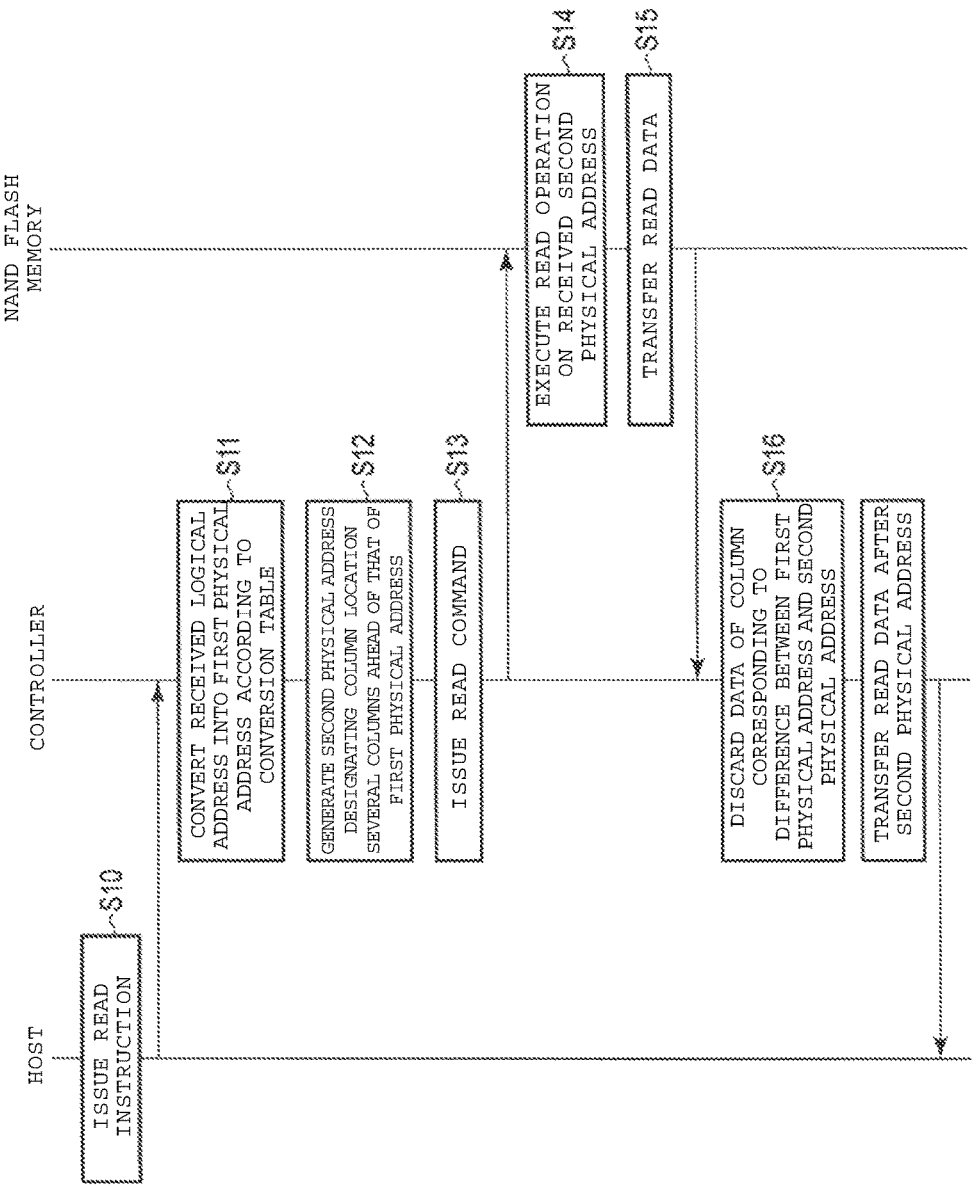
FIG. 6 is a flowchart of a data read method according to the first embodiment.

Next, a data read operation according to the first embodiment will be described. FIG. 6 is a flowchart illustrating operations of the host device 300, the controller 200, and the NAND flash memory 100 at the time of data read in the memory system 1 according to the first embodiment.

As illustrated in the figure, first, the host device 300 issues a read instruction and transmits the read instruction to the controller 200 (Step S10). In this case, the host device 300 transmits the logical address corresponding to an area in which needed data is stored, to the controller 200.

Then, the processor 230 of the controller 200 converts the received logical address into a physical address according to the conversion table held in the built-in memory 220 or the like. That is, the processor 230 obtains the physical address of a physical block BLK holding needed data using the conversion table described in FIG. 5 (Step S11). In the following, the physical address obtained in Step S11 is called a first physical address.

Subsequently, for example, the processor 230 generates a second physical address based on the first physical address (Step S12). The second physical address is an address obtained by shifting the column C to be designated, toward a top column side (i.e., column with a lower column address) from the column designated by the first physical address by several columns or decrementing the column C by several columns.

The processor 230 issues a read command specified in a NAND interface standard (Step S13). The read command and the second physical address are transmitted to the NAND flash memory 100 through the NAND bus.

In the NAND flash memory 100 that received a read command, the sequencer 114 reads one page of data from the block corresponding to the received second physical address (Step S14).

When reading of data from the memory cell array 116 onto the sense amplifier module 118 is completed, the processor 230 of the controller 200 toggles the signal REn/RE. Then, the input and output circuit 110 of the NAND flash memory 100 transmits read data DQ and the signal DQS/DQSn to the controller 200 in response to the signal REn/RE (Step S15). Pieces of data DQ are transferred in units of columns in order starting from the column corresponding to the second physical address.

The controller 200 that received data from the NAND flash memory 100 discards data of the column corresponding to a difference between the first physical address and the second physical address (Step S16). That is, pieces of data for several cycles at the beginning received from the NAND flash memory 100 are discarded. Details thereof will be described later. The controller 200 performs error correction or the like on data received after the column corresponding to the second physical address and then, transfers data to the host device 300.

Figure 7:
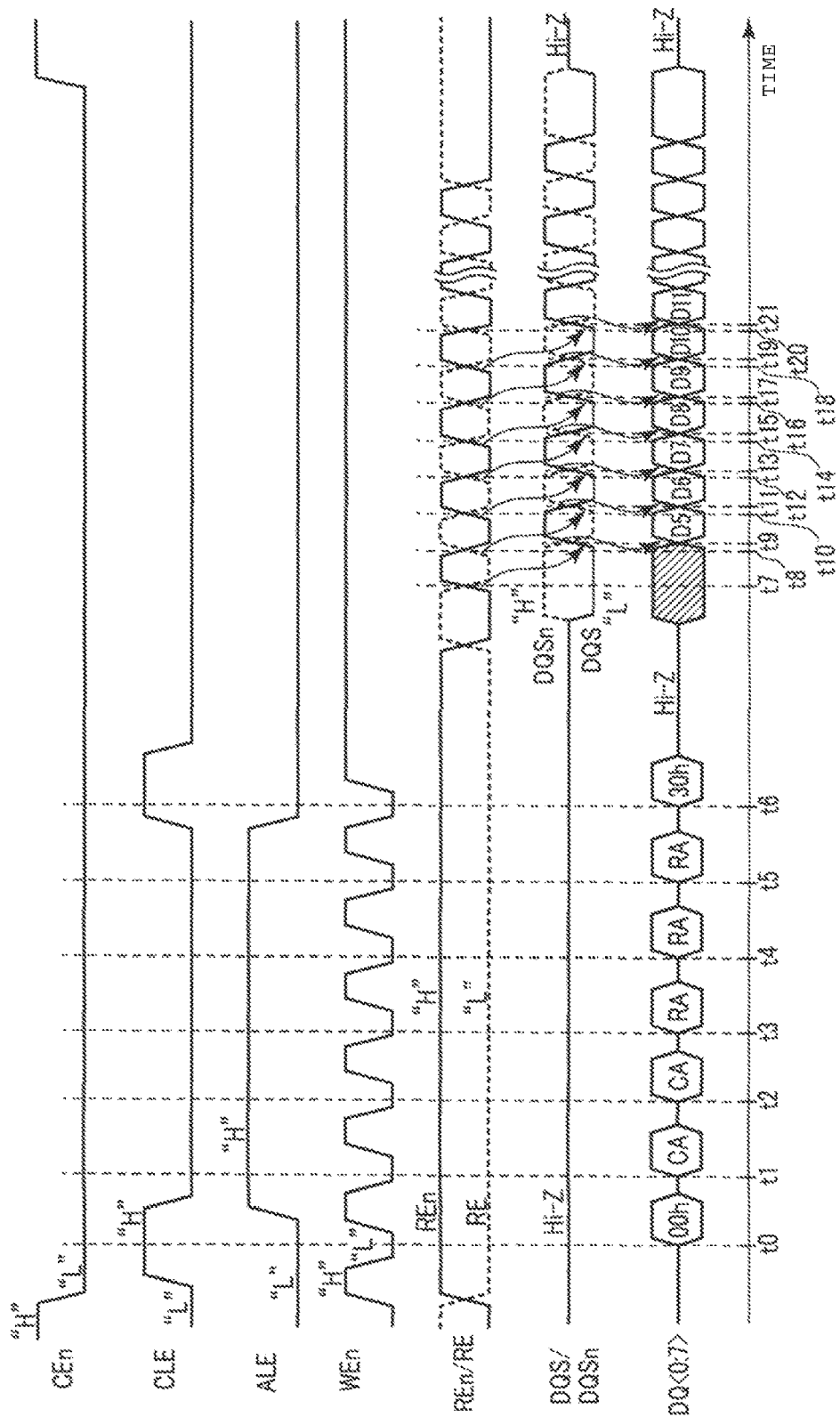
FIG. 7 is a timing chart of various signals at the time of data read according to the first embodiment.

FIG. 7 is a timing chart illustrating signals on the NAND interface in Steps S13 to S15. In FIG. 7, the signals REn and RE are respectively illustrated by the solid line and the dotted line for the complementary signal REn/RE and the signals DQS and DQSn are respectively illustrated by the solid line and the dotted line for the signal DQS/DQSn.

As illustrated in the figure, first, the controller 200 transmits a command "00h" to the NAND flash memory. The command "00h" is a command issued before an address is input at the time of the read operation. In this case, for example, the NAND interface 250 of the controller 200 allows the signal CLE to go to an "H" level, allows the signal ALE to go to an "L" level, and allows the signal WEn to go to the "L" level. The signal REn goes to the "H" level and the signal line of the signal DQS/DQSn becomes in a high impedance state. As a result, the command "00h" is held in the command register 113.

Subsequently, the controller 200 transmits the address over five cycles. That is, a column address CA is transmitted for the first two cycles and a row address (which designates the block address and the page address) RA is transmitted for three cycles after the two cycles. In this case, the NAND interface 250 allows the signal CLE to go to the "L" level and allows the signal ALE to go to the "H" level and toggles the signal WEn. As a result, the addresses CA and RA are held in the address register 112.

Next, the controller 200 transmits a command "30h" to the NAND flash memory. The command "30h" is a command that instructs the NAND flash memory 100 to read data from the memory cell array 116. When the command "30h" is stored in the command register 113, a data read operation is started in the NAND flash memory 100 according to the instruction from the sequencer 114 and the NAND flash memory 100 goes into a busy state (i.e., a state at which a normal instruction is not allowed to be received from controller 200). That is, in the NAND flash memory 100, the row decoder 117 decodes the row address RA, data is read onto the sense amplifier module 118 from a page designated by the row address RA, and data is transferred to the data register 119. The column decoder 120 decodes the column address CA.

When the NAND flash memory 100 goes into a ready state (i.e., state at which a normal instruction is allowed to be received from controller 200), the NAND interface 250 toggles the signal REn/RE. The signal REn/RE is toggled such that read data is transmitted from the data register 119 to the controller 200 through the input and output circuit 110.

In the example of FIG. 7, the input and output circuit 110 of the NAND flash memory 100 allows the signal DQS to go to the "H" level (DQSn goes to "L" level) at time t9 in synchronization with timing at which the signal REn goes to the "H" level (RE goes to "L" level) at time t7. Furthermore, the input and output circuit 110 transmits read data D5 from the latch circuit LC5 corresponding to the column (in the present example, it is assumed that the column address is CA5 and the corresponding column is C5) decoded by the column decoder 120 to the controller 200 in synchronization with the signal DQS/DQSn. The column address CA5 corresponds to the second physical address described in FIG. 6.

Thereafter, the controller 200 toggles the signal REn/RE according to a needed amount of data. Each time when the signal is toggled, the column address CA is incremented in the column decoder 120 or the address register 112. As a result, piece of data D6 to D11 are transmitted to the controller 200 at times t11, t13, t15, t17, t19, and t21, respectively.

Figure 8:
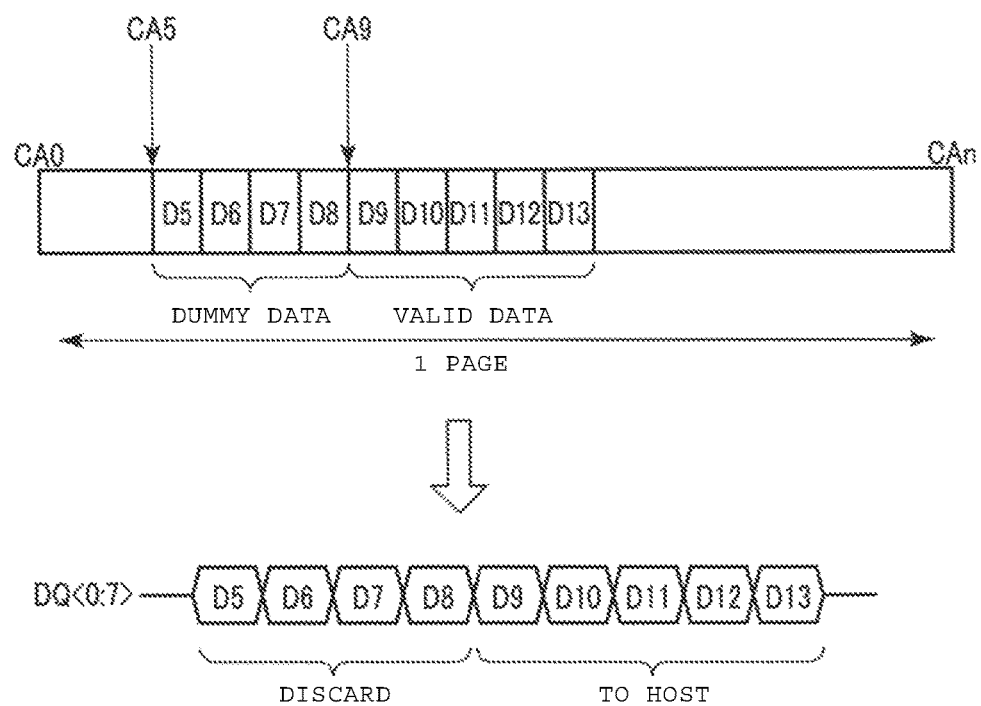
FIG. 8 is a conceptual diagram of the data read method according to the first embodiment.

Among the pieces of read data transmitted to the controller 200, as described in Step S16 of FIG. 6, pieces of data corresponding to the first several cycles are discarded. The state is illustrated in FIG. 8. FIG. 8 illustrates a block diagram of the data register 119 that holds one page of data and a state of the signal DQ at the time of transmitting data. In FIG. 8, a case where a column designated by the first physical address corresponding to a logical address given from the host device 300 is C9 (column address is CA9) and data cycles discarded by the controller 200 are four cycles is illustrated.

As illustrated in the figure, the controller 200 generates the column address CA5 that designates the column C5 as the second physical address and transmits the column address CA5 together with the row address RA to the NAND flash memory 100. Data requested from the host device 300 is data after the column C9 (column address CA9) and thus, the controller 200 handles pieces of data D5 to D8 between the columns C5 to C9 as dummy data. That is, when the pieces of data D5 to D8 are received in the NAND interface 250, the pieces of data D5 to D8 are discarded without being subjected to ECC processing, or the like. The controller 200 handles pieces of data D9, D10, D11, . . . , after the column C9 as pieces of valid data, performs ECC processing or the like on the pieces of data D9, D10, D11, . . . , and transmits the pieces of data D9, D10, D11, . . . , to the host device 300.

1.3 Effect of First Embodiment

According to the first embodiment, it is possible to improve operational reliability of the memory system. In the following, the effect will be described.

As illustrated in FIG. 1, when a plurality of memory chips 100 are connected to a memory controller 200, a load of the NAND bus becomes large. Then, when a differential signal such as the signal REn or the signal DQS, which becomes a reference signal on the NAND interface, starts to oscillate after a preamble period, sufficient amplitude may not be obtained in the first several cycles.

Figure 9:
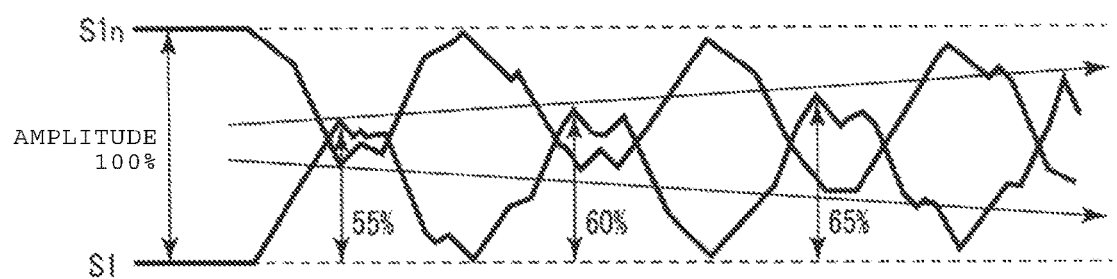
FIG. 9 is a timing chart of complementary signals illustrating the time required by the complementary signals to attain maximum amplitude.

FIG. 9 illustrates waveforms of a certain differential signal S1/S1n immediately after oscillation. As illustrated in the figure, amplitude of the signal S1 is only 55% of the maximum amplitude in the first cycle, the amplitude becomes 60% of the maximum amplitude in the second cycle, and the amplitude approaches the maximum amplitude as time passes by. The signal S1n is also similar. As such, the fact that sufficient amplitude is not obtained becomes prominent as the oscillation frequency of a signal becomes higher and may become a problem in a double data rate (DDR) NAND flash memory. This state is illustrated in FIG. 10.

Figure 10:
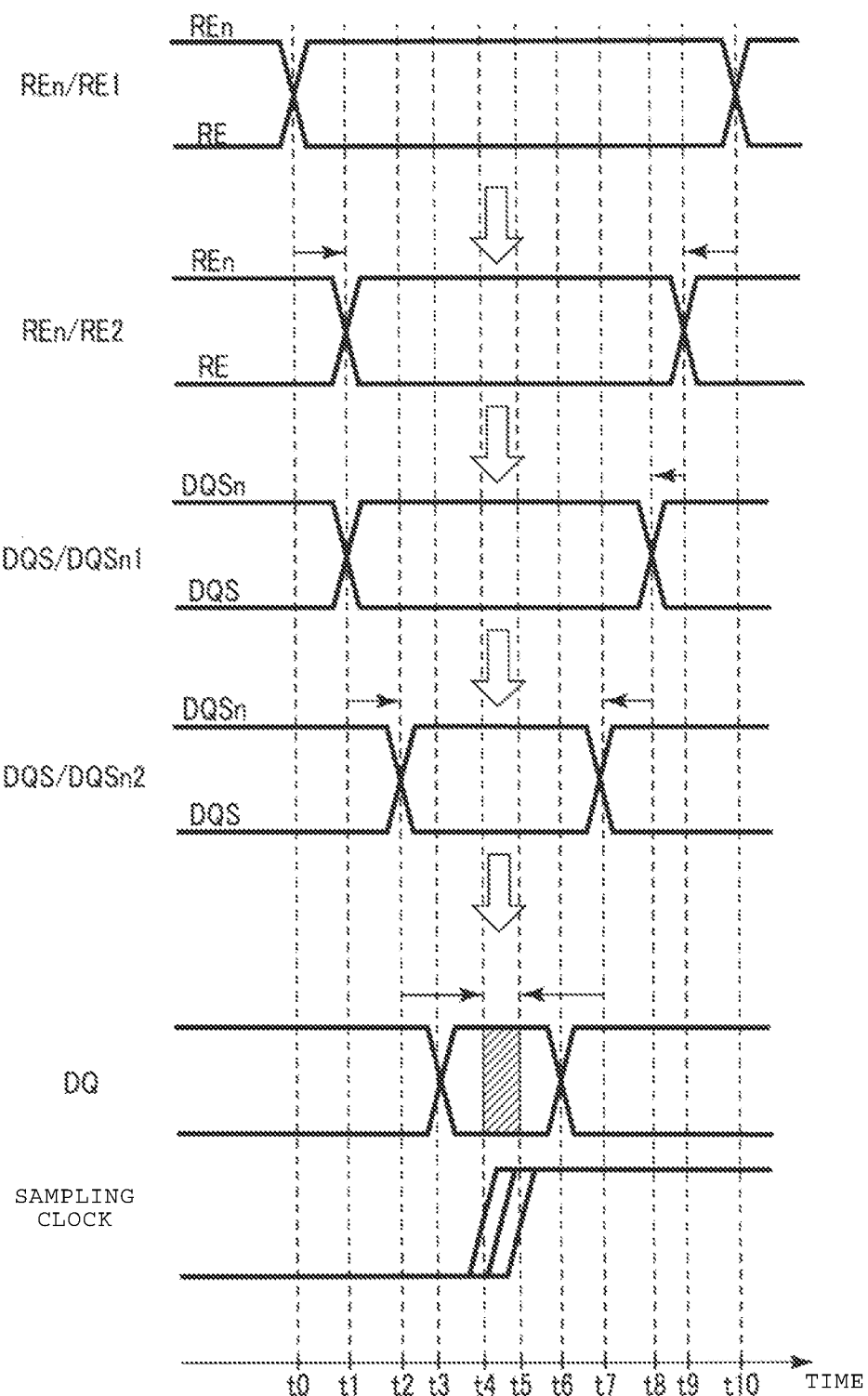
FIG. 10 is a timing chart of various signals at the time of reading.

REn/RE1 of FIG. 10 corresponds to an oscillation waveform of the signal REn/RE in a state where a load is small. The signal REn/RE is asserted at a period from time t0 to time t10. However, when a plurality of memory chips are connected to the NAND bus and the load of the NAND bus becomes large, as described in FIG. 9, sufficient amplitude is not obtained in the signal REn/RE immediately after oscillation and a period during which the signal REn/RE is asserted becomes substantially shorter as illustrated in REn/RE2 of FIG. 10.

In the NAND flash memory, the signal DQS/DQSn is generated by using the signal illustrated in REn/RE2 as a source signal. When the load of the NAND bus is small, a signal waveform illustrated with DQS/DQSn1 in FIG. 10 is obtained. Rising of the signal DQS is performed substantially simultaneously with falling of the signal REn and falling of the signal DQS falls earlier by a period having a certain margin from rising of the signal REn.

However, similar to the signal REn/RE, when the load of the NAND bus becomes large, sufficient amplitude is not obtained in the signal DQS/DQSn immediately after oscillation and as illustrated in DQS/DQS2 of FIG. 10, a period during which the signal DQS/DQSn is asserted becomes substantially shorter. In the example of FIG. 10, an assertion period is a period from time t2 to time t7.

Data DQ is transmitted to the controller 200 in synchronization with the signal illustrated in DQS/DQSn2 of FIG. 10. Accordingly, data DQ is transmitted in a period from time t3 to time t6 having a further margin with respect to the period from time t2 to time t7. In the controller 200, data is sampled in a period spanning from time t4 to time t5 and having a further margin.

As described above, when a load of the bus is increased in the differential signal oscillating at a higher frequency, it becomes difficult to sufficiently obtain a period during which data is sampled. Although illustration is omitted in FIG. 10, this is also similar to data DQ as well as the signal REn/RE and signal DQS/DQSn that function as clocks at the time of transmitting data. In the case of data DQ, the "H" level or the "L" level is handled depending on data, differently from the clocks such as the REn/RE and the DQS/DQSn. However, when data is written into the memory cell array 116, pieces of data are randomized by the controller 200 so that piece of "0" data or pieces of "1" data are not unevenly (i.e., more evenly) distributed. Then, similar to the clock, data DQ also becomes a signal oscillating at a high frequency and may have the same problem as that of the clock.

In this respect, in a read method according to the first embodiment, the controller 200 generates a column address (CA5 in the example of FIG. 8) obtained by shifting the column address (CA9 in the example of FIG. 8), which corresponds to the logical address received from the host device 300 and to be accessed originally, to a top address side. Pieces of data are read from the NAND flash memory 100 in order from the shifted column address. However, pieces of data between the shifted column address and the column address to be accessed originally are discarded without being transmitted to the host device 300. That is, pieces of data read at the clocks in which erroneous reading becomes easy to occur as described in FIGS. 9 and 10 are discarded. Thereafter, needed pieces of data are received by the controller 200 in a state where oscillation of the clocks is stable.

In the examples of FIGS. 7 and 8, a case where the number of dummy cycles until oscillation of the clocks becomes stable is four cycles was described by way of an example. However, the number of dummy cycles may be appropriately selected according to characteristics of the memory chip and the controller chip or the number of memory chips connected to the controller chip. In the first embodiment, data read for the first four cycles is useless data and may be regarded as a useless read operation. However, data read during the four cycles during which oscillation is not stable are not used and the four cycles make it possible to sufficiently increase the frequency of the clock after becoming a stable state. Accordingly, in read operation, even though useless four cycles are added, an entire speed of the read operation is improved and also occurrence of erroneous reading may be prevented.

2. Second Embodiment

Next, a memory system according to the second embodiment will be described. The second embodiment relates to operations of the data register 119 of the NAND flash memory 100 in the first embodiment. In the following, only matters different from the first embodiment will be described.

2.1 Read Operation

Figure 11:
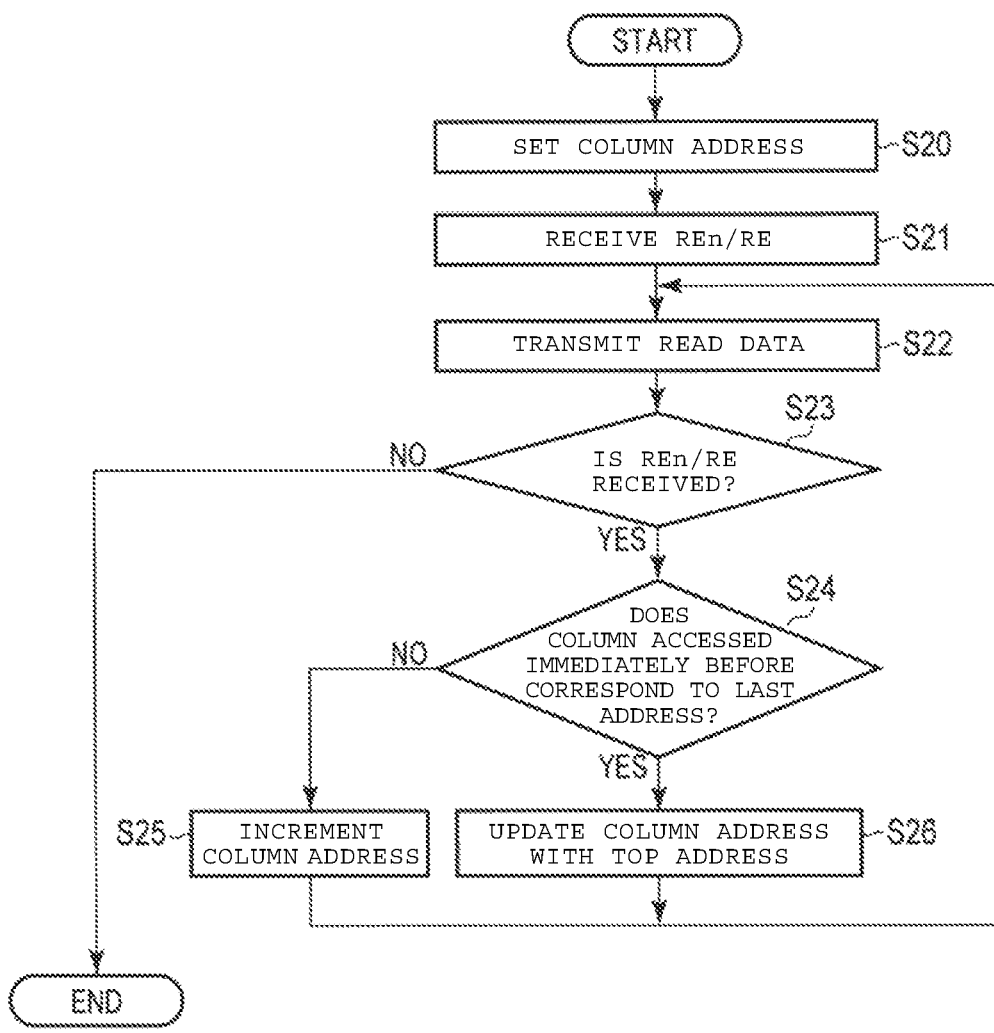
FIG. 11 is a flowchart of a data read method according to a second embodiment.

Description will be made on operations of the NAND flash memory 100 at the time of data read according to the second embodiment using FIG. 11. FIG. 11 is a flowchart focused especially on a column system operation at the time of data read and corresponds to Steps S14 and S15 described in FIG. 6 of the first embodiment.

As illustrated in the figure, first, the physical addresses received from the controller 200 are set in the address register 112 and the column address CA among the addresses is transferred to the column decoder 120 (Step S20). When the sequencer 114 receives the signal REn/RE (Step S21), the data register 119 transfers one column of data from a latch circuit LC corresponding to the column address decoded by the column decoder 120 to the input and output circuit 110 and the input and output circuit 110 transmits the one column of data to the controller 200 in synchronization with the signal DQS/DQSn (Step S22).

Thereafter, when the signal REn/RE is not received (NO in Step S23), the read operation is ended. On the other hand, in a case where the signal REn/RE is received (YES in Step S23), the sequencer 114 determines whether the column accessed immediately before corresponds to the last column address or not (Step S24). When it is determined that it is not the last column address (NO in Step S24), the sequencer 114 increments the column address CA within the address register 112 and transfers the column address to the column decoder 120 or increments the column address transferred to the column decoder 120 (Step S25). Then, as described in Step S22, the data register 119 transfers one column of data corresponding to the incremented column address to the input and output circuit 110 and the input and output circuit 110 transmits one column of data to the controller 200 in synchronization with the signal DQS/DQSn.

On the other hand, in a case where it is determined that the column accessed immediately before is the last column address (YES in Step S24), the sequencer 114 updates the column address CA within the address register 112 with the top address of a page and transfers the column address to the column decoder 120, or updates the column address transferred to the column decoder 120 with the top address (Step S26). Then, as described in Step S22, the data register 119 transfers one column of data corresponding to the top address of the page to the input and output circuit 110 and the input and output circuit 110 transmits the one column of data to the controller 200 in synchronization with the signal DQS/DQSn.

Figure 12:
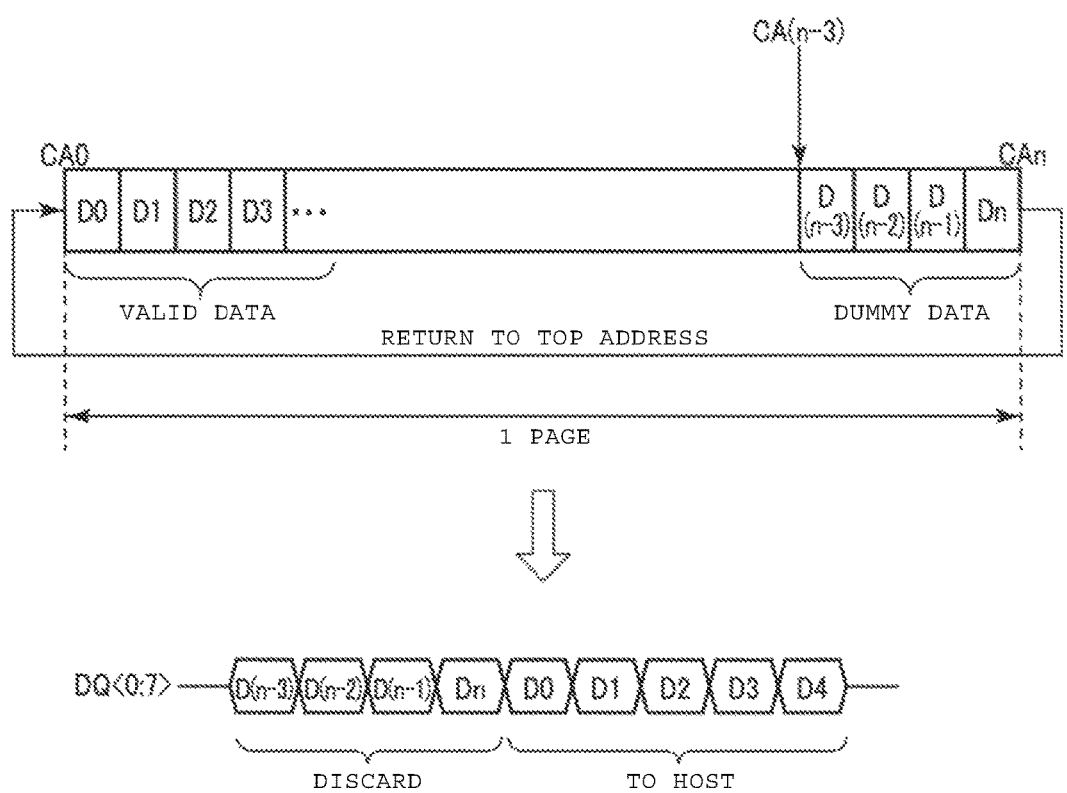
FIG. 12 is a conceptual diagram of the data read method according to the second embodiment.

Similar to FIG. 8 described in the first embodiment, FIG. 12 illustrates a block diagram of the data register 119 holding one page of data and a state of the signal DQ at the time of transmitting data. In FIG. 12, a case where the top column (column address CA0) of one page is designated by the logical address is illustrated.

As illustrated in the figure, a controller 200 generates a column address CA(n−3) which designates a column C(n−3) four columns before the top column address CA0, as a second physical address. In the controller 200, in a case where the column address is decremented, when the column address reaches the top address CA0, then the column address transits to the last column address CAn.

Accordingly, the NAND flash memory 100 sequentially outputs D(n−3), D(n−2), . . . , each time when the signal REn/RE is toggled. When data Dn corresponding to the last column address CAn is output, the column address CA is updated with the top column address CA0. Thereafter, the column address CA is incremented again and data D0, D1, D3, . . . , are sequentially output.

In this case, data D(n−3), D(n−2), D(n−1), and Dn for the first four cycles are discarded. As a result, pieces of page data are transferred to the controller 200 in order from the top column, as pieces of valid data, ECC processing or the like is performed on the pieces of page data, and pieces of page data are transmitted to the host device 300.

2.2 Effect According to Second Embodiment

According to the NAND flash memory 100 of the second embodiment, the column address CA returns to the top address in synchronization with the signal REn/RE after reaching the last address. With this, even in a case where the method described in the first embodiment is applied, it is possible to freely set a reading start column.

3. Third Embodiment

Next, a memory system according to a third embodiment will be described. The third embodiment relates to a specific example in which unneeded data is discarded in the controller 200. In the following, matters different from the first and second embodiments will be described.

3.1 Configurations of NAND Flash Memory 100 and Controller 200

Figure 13:
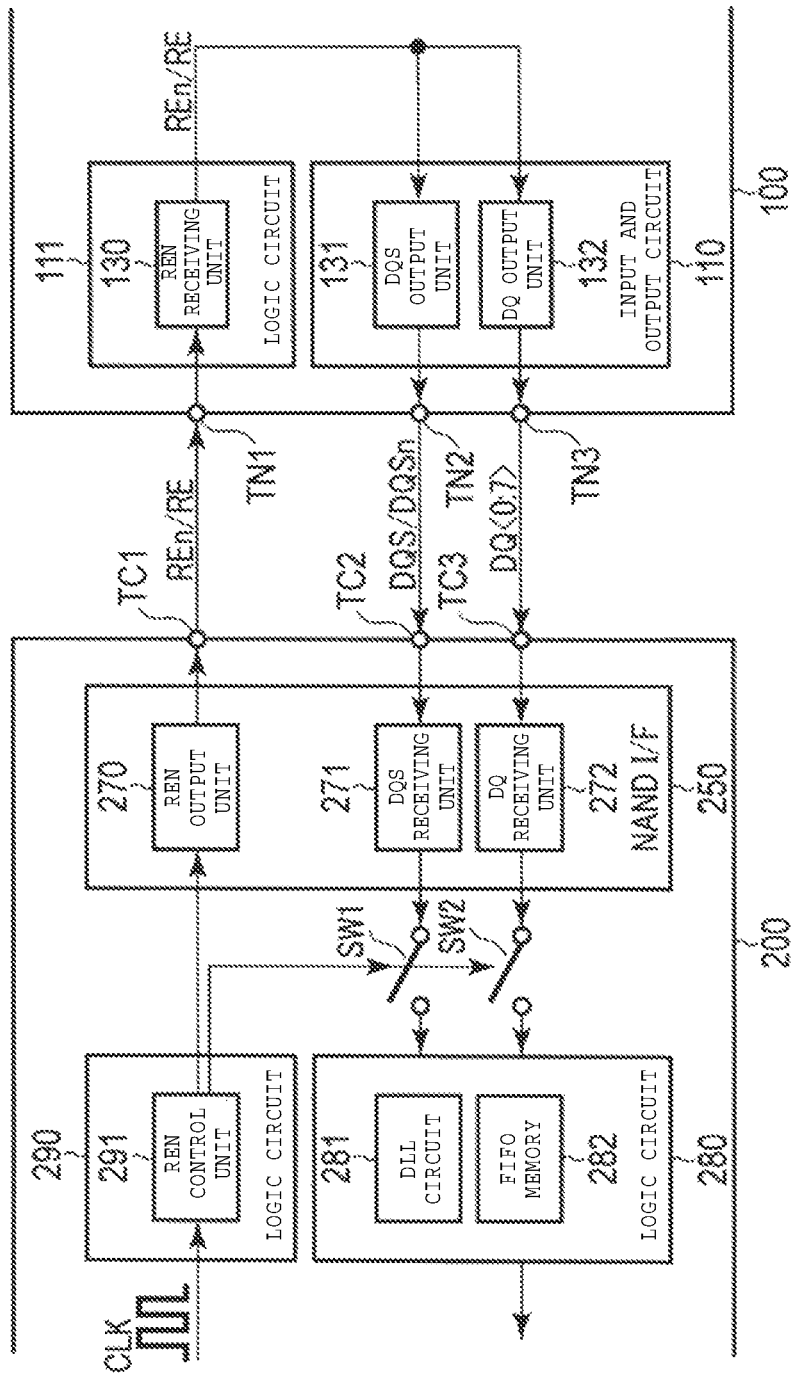
FIG. 13 is a block diagram of a partial area of a memory system according to a third embodiment.

FIG. 13 illustrates a block configuration of an input and output system at the time of data read in the NAND flash memory 100 and the controller 200.

As illustrated in the figure, the controller 200 includes a logic circuit 290 of an input system and a logic circuit 280 of an output system. The logic circuits 290 and 280 include, for example, the processor 230, the ECC circuit 260, the RAM 220, and the buffer memory 240 described in FIG. 1. The logic circuit 290 includes an REn control unit 291. The REn control unit 291 generates, for example, the signal REn/RE based on a clock CLK given from a clock generator provided within the controller 200.

The NAND interface 250 includes an REn output unit 270, a DQS receiving unit 271, and a DQ receiving unit 272. The REn output unit 270 receives the signal REn/RE from the REn control unit 291 and transmits the signal REn/RE from the REn/RE output terminal TC1 to the NAND flash memory 100.

The logic circuit 111 of the NAND flash memory 100 includes an REn receiving unit 130. The REn receiving unit 130 receives the signal REn/RE from the controller 200 through an REn/RE input terminal TN1 of the NAND flash memory.

The input and output circuit 110 includes a DQS output unit 131 and a DQ output unit 132. The DQS output unit 131 generates the signal DQS/DQSn based on the signal REn/RE received from the REn receiving unit 130 and transmits the signal DQS/DQSn from a DQS/DQSn output terminal TN2 to the controller 200. The DQ output unit 132 receives one column of data DQ from the data register 119 and transmits one column of data DQ from a DQ output terminal TN3 to the controller 200 in synchronization with the signal REn/RE received from the REn receiving unit 130 and the signal DQS/DQSn received from the DQS output unit 131.

The DQS receiving unit 271 of the NAND interface 250 receives the signal DQS/DQSn from the NAND flash memory 100 through a DQS input terminal TC2 of the controller 200 and transfers the signal DQS/DQSn to the logic circuit 280. The DQ receiving unit 272 receives the signal DQ from the NAND flash memory 100 through a DQ input terminal TC3 of the controller 200 and transfers the signal DQ to the logic circuit 280.

The logic circuit 280 includes a DLL circuit 281 and a FIFO memory 282. The DLL circuit 281 aligns edge timing of the signal DQS and the signal DQ received from the DQS receiving unit 271 and the DQ receiving unit 272. The FIFO memory 282 temporarily holds the signal DQS of which timing is aligned by the DLL circuit 281. Data held in the FIFO memory 282 is then subjected to error correction or the like and is transmitted to the host device 300.

The controller 200 further includes switches SW1 and SW2 between the DQS receiving unit 271 and DQ receiving unit 272 and the logic circuit 280. The switch SW1 is provided on a transfer path of the signal DQS/DQSn and the switch SW2 is provided on a transfer path of the signal DQ. The switches SW1 and SW2 are controlled by, for example, the REn control unit 291 of the logic circuit 290 so as to cause the signal DQS/DQSn and the signal DQ to be subjected to gating. In this case, the REn control unit 291 turns the switches SW1 and SW2 OFF for a period of dummy cycles of the signal DQS/DQSn and turns the switches SW1 and SW2 ON after the lapse of the dummy cycles. With this, valid data is transferred to the FIFO memory 282 but dummy data is not transferred to the FIFO memory 282.

3.2 Effect According to Third Embodiment

For example, the configuration described in the third embodiment may be applied to the first and second embodiments described.

4. Modification Example or the Like

As described above, a memory system according to the third embodiment includes the semiconductor memory (100) and the controller (200). The semiconductor memory (100) is able to hold data. The controller (200) receives the first logical address from the host (300), issues the second physical address (CA5 in FIG. 8) different from the first physical address (CA9 in FIG. 8) corresponding to the first logical address to the semiconductor memory (100), and reads data from the semiconductor memory.

In other words, the controller 200 according to the third embodiment causes second data (D5 to D13 in FIG. 8) different from first data to be read from the semiconductor memory when the read instruction according to the first logical address (CA9 in FIG. 8) is issued to the semiconductor memory immediately after first data (D9 to D13 in FIG. 8) is written into the semiconductor memory according to the first logical address (CA9 in FIG. 8) received from the host device 300. Second data, as described in FIG. 8, includes third data (D5 to D8 in FIG. 8) and first data (D9 to D13 in FIG. 8) following third data. This is because the controller, at the time of an read operation, converts the received first logical address into the first physical address based on the table and instructs the semiconductor memory to write data into an area corresponding to the first physical address while the controller, at the time of a write operation, converts the first logical address into the first physical address and further converts the first physical address into the second physical address so that the column address is shifted to the top column side in the page (FIG. 8).

By the present configuration, it is possible to transfer data using the clock being in a stable state and improve operational reliability of the memory system. The embodiments are not limited to aspects described and various modifications may be made thereto. For example, in the example of FIG. 8, a case where pieces of data for four cycles after the signals REn/RE and DQS/DQSn start to oscillate are discarded as dummy data is described. It should be noted that the number of dummy cycles is not limited to four cycles and can be set to arbitrary number of cycles. The number of cycles may be variably set. For example, a Set feature command or the like is used so as to allow the number of cycles to be set to be larger than the number of cycles which is set immediately after shipment when the memory system itself can be deteriorated.

Dummy data may be held in, for example, the buffer memory 240 of the controller 200 or the like without being discarded. Each time when the read instruction from the host device 300 is repeated, a piece of dummy data is accumulated in the buffer memory 240. When pieces of data accumulated in the buffer memory 240 coincide with data requested by the host device 300, data may be read from the buffer memory 240 and reading of data from the memory cell array is not needed.

A column shift is not needed for a case of the read operation that does not need to transfer data to the controller 200. For example, in a case where an instruction is not received from the host device 300 or the controller 200 and data is copied from a certain block to another block within the NAND flash memory 100, the NAND flash memory 100 does not need a column shift as a matter of course. Even in a case where the controller 200 issues a read instruction, when data for the read instruction is not transferred to the controller 200, the column shift is not needed.

In the embodiments, as a semiconductor storage device, the NAND flash memory is described by way of an example. However, the present invention may be applied to the entire semiconductor device in which a load on a bus is large and time is taken for stabilization of a signal at the time of transferring data without being limited to the NAND flash memory.

In respective embodiments, (1) In a read operation, when it is assumed that the memory cell transistor MT holds data of two bits and the thresholds thereof are set as E level, A level, B level, and C level in order from the lowest voltage, a voltage to be applied to a word line selected for a read operation of the A level is, for example, between 0 V and 0.55 V, but is not limited thereto and may include any of ranges between 0.1 V and 0.24 V, between 0.21 V and 0.31 V, between 0.31 V and 0.4 V, between 0.4 V and 0.5 V, and between 0.5 V and 0.55 V.

A voltage to be applied to a word line selected for a read operation of the B level is, for example, between 1.5 V and 2.3 V, but is not limited thereto and may include any of ranges between 1.65 V and 1.8 V, between 1.8 V and 1.95 V, between 1.95 V and 2.1 V, and between 2.1 V and 2.3 V.

A voltage to be applied to a word line selected for a read operation of the C level is, for example, between 3.0 V and 4.0 V, but is not limited thereto and may include any of ranges between 3.0 V and 3.2 V, between 3.2 V and 3.4 V, between 3.4 V and 3.5 V, between 3.5 V and 3.6 V, and between 3.6 V and 4.0 V.

The time (tR) for a read operation may be, for example, between 25 μs and 38 μs, between 38 μs and 70 μs, and between 70 μs and 80 μs.

(2) A write operation includes a program operation and a verify operation. In the write operation, a voltage to be applied at first to a word line selected at the time of the program operation is, for example, between 13.7 V and 14.3 V, but is not limited thereto and may include any of ranges, for example, between 13.7 V and 14.0 V and between 14.0 V and 14.6 V.

A voltage to be applied at first to a word line selected when writing is performed on an odd-numbered word line and a voltage to be applied at first to a word line selected when writing is performed on an even-numbered word line may be varied.

When the program operation is performed using an incremental step pulse program (ISPP) scheme, a voltage, for example, an approximately 0.5 V is used as voltage of a step amplifier.

A voltage to be applied to a non-selected word line may be, for example, between 6.0 V and 7.3 V, but is not limited thereto, may be set, for example, between 7.3 V and 8.4 V, and may be set to be less than or equal to 6.0 V.

A pass voltage to be applied may be varied according to whether the non-selected word line is an odd-numbered word line or an even-numbered word line.

The time (tProg) for a write operation may be, for example, between 1700 μs and 1800 μs, between 1800 μs and 1900 μs, and between 1900 μs and 2000 μs.

(3) In an erasing operation, a voltage to be applied at first to a well, which is formed on an upper portion of a semiconductor substrate and the memory cell is disposed above the well, is, for example, between 12 V and 13.6 V, but is not limited thereto and may include any of ranges, for example, between 13.6 V and 14.8 V, between 14.8 V and 19.0 V, between 19.0 V and 19.8 V, and between 19.8 V and 21 V.

The time (tErase) for the erasing operation may be, for example, between 3000 μs and 4000 μs, between 4000 μs and 5000 μs, and between 4000 μs and 9000 μs.

(4) A structure of the memory cell may be a structure described in the following. That is, the memory cell includes a charge storage layer disposed on a semiconductor substrate (silicon substrate) through a tunnel insulation film having a film thickness of 4 to 10 nm. The charge storage layer may have a stacked structure formed with an insulation film, such as SiN or SiON, having a film thickness of 2 to 3 nm, and a polysilicon film having a film thickness of 3 to 8 nm. Metal such as Ru may be added to the polysilicon film. An insulation film may be formed on the charge storage layer. The insulation film may include a silicon oxide film having a film thickness of 4 to 10 nm and sandwiched between, for example, a lower layer of High-k film having a film thickness of 3 to 10 nm and a higher layer of High-k film having a film thickness of 3 to 10 nm. The High-k film includes HfO or the like. The film thickness of silicon oxide film may be thicker than the film thickness of the High-k film. A control electrode having a film thickness of 30 to 70 nm is formed on the insulation film through a material which has a film thickness is 3 to 10 nm and is for adjusting a work function. Here, the material for adjusting a work function is a metal oxide film such as TaO or a metal nitride film such as TaN. W or the like may be used in the control electrode.

An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory; and
a controller configured to perform a read operation on the semiconductor memory in response to a read instruction received from a host, wherein
in response to the read instruction that includes a first logical address, the controller converts the first logical address into a first physical address, and issues a read command and a second physical address different from the first physical address, to the semiconductor memory, wherein
the semiconductor memory includes a plurality of memory cells associated with a row address and a column address, and decodes a physical address received from the controller into a row address and a column address, and
the row addresses corresponding to the first and second physical addresses are the same, and the column address corresponding to the first physical address is different from the column address corresponding to the second physical address.

2. The memory system according to claim 1, wherein the controller determines the second physical address from the first physical address by shifting the column address corresponding to the first physical address.

3. The memory system according to claim 1, wherein the semiconductor memory includes a memory cell array including the plurality of memory cells, and is configured to read data in a unit of a page from the memory cell array when the read command and the second physical address are received from the controller and transfer the read data in units less than a size of the page to the controller in order, starting from a column address corresponding to the second physical address and then incrementing the column address each time a first clock is received from the controller after the read command.

4. The memory system according to claim 3, wherein the semiconductor memory is configured to transfer data corresponding to a top column address to the controller when the first clock is further received after the column address has reached the last column address.

5. The memory system according to claim 4, wherein the semiconductor memory transmits the read data together with a second clock to the controller, and
the controller includes a receiving circuit that receives the second clock and the read data, and a buffer circuit into which the read data received during a first plurality of cycles of the second clock are not stored and the read data received after the first plurality of cycles of the second clock are stored.

6. The memory system according to claim 5, wherein the number of cycles in the first plurality of cycles of the second clock corresponds to a difference between the column address corresponding to the first physical address and the column address corresponding to the second physical address.

7. A memory system comprising:
a semiconductor memory; and
a controller configured to perform a read operation on the semiconductor memory in response to a read instruction received from a host, wherein
when the controller issues a read command to the semiconductor memory for first data immediately after the first data is written into the semiconductor memory, second data different from the first data is returned from the semiconductor memory, the second data including third data and first data following the third data, and
the semiconductor memory includes a plurality of memory cells associated with a row address and a column address, and a write operation is executed on the semiconductor memory responsive to a host write instruction including a first logical address, beginning at a first column address, and a read operation is executed on the semiconductor memory responsive to a host read instruction including the first logical address beginning at a second column address that is different from the first column address.

8. The memory system according to claim 7, wherein the controller discards the third data.

9. The memory system according to claim 7, wherein the semiconductor memory is configured to read data in a unit of a page from the memory cell array when a read command is received from the controller and to write data in the unit of the page into the memory cell array when a write command is received from the controller, and
the controller includes a table storing a mapping of logical addresses to physical addresses, including a mapping from the first logical address to a first physical address that specifies the first column address, the table not including any mapping from the first logical address to a second physical address that specifies the second column address.

10. The memory system according to claim 9, wherein
at the time of the write operation, the controller converts the first logical address into the first physical address based on the table and issues a write command to the semiconductor memory to write data into an area corresponding to the first physical address, and
at the time of the read operation, the controller converts the first logical address into the first physical address based on the table, further converts the first physical address into a second physical address so that the column address is shifted, and issues a read command to the semiconductor memory to read data from an area corresponding to the second physical address.

11. A method of performing a read operation on a semiconductor memory, comprising:
in response to a read instruction received from a host, converting a first logical address included in the read instruction into a first physical address, and issuing a read command and a second physical address different from the first physical address, to the semiconductor memory; and
partially buffering data returned from the semiconductor memory in response to the read command and the second physical address, wherein the data are returned over a plurality of clock cycles and the data returned during a first plurality of clock cycles are not buffered and the data returned after the first plurality of cycles are buffered.

12. The method according to claim 11, wherein the semiconductor memory includes a plurality of memory cells associated with a row address and a column address, and decodes a physical address into a row address and a column address, and the row addresses corresponding to the first and second physical addresses are the same, and the column address corresponding to the first physical address is different from the column address corresponding to the second physical address.

13. The method according to claim 12, further comprising:

determining the second physical address from the first physical address by shifting the column address corresponding to the first physical address.

14. The method according to claim 11, wherein wherein the semiconductor memory includes a memory cell array including a plurality of memory cells, and is configured to read data in a unit of a page from the memory cell array in response to a read command and a physical address that are issued thereto and return the read data in units less than a size of the page in order, starting from a column address corresponding to the physical address and then incrementing the column address each time a first clock is received after the read command.

15. The method according to claim 14, wherein the semiconductor memory is configured to return data corresponding to a top column address when the first clock is further received after the column address has reached the last column address.

16. The method according to claim 11, wherein the number of cycles in the first plurality of cycles corresponds to a difference between the column address corresponding to the first physical address and the column address corresponding to the second physical address.

17. A memory system comprising:

a semiconductor memory including a plurality of memory cells associated with a row address and a column address; and a controller configured to, in response to a read request received from a host, the read request including a first logical address, convert the first logical address into a first physical address, and read data from a second physical address of the semiconductor memory, wherein the row addresses corresponding to the first and second physical addresses are the same, and the column address corresponding to the first physical address is different from the column address corresponding to the second physical address.

18. The memory system according to claim 17, wherein the controller is further configured to discard a part of the read data that does not correspond to the first physical address.

19. The memory system according to claim 17, wherein the controller is further configured to not transmit to the host, a part of the read data that does not correspond to the first physical address.

20. The memory system according to claim 17, wherein the controller is further configured to:

discard a first part of the read data that does not correspond to the first physical address; and perform an error correction on a second part of the read data that corresponds to the first physical address.

21. The memory system according to claim 20, wherein the controller is further configured to not transmit to the host, the first part of the read data that does not correspond to the first physical address.

22. The memory system according to claim 20, wherein the controller is further configured to transmit to the host, the second part of the read data that corresponds to the first physical address.

23. A method of performing a read operation on a semiconductor memory, the semiconductor memory including a plurality of memory cells associated with a row address and a column address, said method comprising:

in response to a read request received from a host, the read request including a first logical address, converting the first logical address into a first physical address, and reading data from a second physical address of the semiconductor memory, wherein the row addresses corresponding to the first and second physical addresses are the same, and the column address corresponding to the first physical address is different from the column address corresponding to the second physical address.

24. The method according to claim 23, further comprising:

discarding a part of the read data that does not correspond to the first physical address.

25. The method according to claim 23, further comprising:

not transmitting to the host, a part of the read data that does not correspond to the first physical address.

26. The method according to claim 23, further comprising:

discarding a first part of the read data that does not correspond to the first physical address; and performing an error correction on a second part of the read data that corresponds to the first physical address.

27. The method according to claim 26, further comprising:

not transmitting to the host, the first part of the read data that does not correspond to the first physical address.

28. The method according to claim 26, further comprising:

transmitting to the host, the second part of the read data that corresponds to the first physical address.

* * * * *